United States Patent
Yang

(10) Patent No.: US 8,039,764 B2
(45) Date of Patent: Oct. 18, 2011

(54) CUSHIONING MEMBER AND ELECTRONIC DEVICE WITH SUCH CUSHIONING MEMBER

(75) Inventor: Ming-Tang Yang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 326 days.

(21) Appl. No.: 12/413,337

(22) Filed: Mar. 27, 2009

(65) Prior Publication Data

US 2009/0255726 A1    Oct. 15, 2009

(30) Foreign Application Priority Data

Apr. 10, 2008    (TW) ................................ 97113040 A

(51) Int. Cl.
*H05K 9/00* (2006.01)
(52) U.S. Cl. .................... 174/377; 174/138 G; 174/544; 361/816
(58) Field of Classification Search .............. 174/138 G, 174/377, 535, 544, 394; 361/816
See application file for complete search history.

(56) References Cited

U.S. PATENT DOCUMENTS

| 6,399,888 B1 * | 6/2002 | Chen .......................... 174/138 G |
| 6,768,654 B2 * | 7/2004 | Arnold et al. ................. 361/818 |
| 7,733,667 B2 * | 6/2010 | Qin et al. ..................... 361/804 |

* cited by examiner

*Primary Examiner* — Hung Ngo

(57) ABSTRACT

A cushioning member for use in a circuit board includes an elastic main body and a fixing element. The fixing element is coupled with the elastic main body and aligned with a perforation of the circuit board. The fixing element includes an extension part and a fastening part. The extension part is arranged between the elastic main body and the fastening part. The fastening part is arranged on an end of the fixing element. The fastening part is sustained against a first surface of the circuit board and the extension part is received in the perforation after the fixing element is penetrated through the perforation, so that the cushioning member is combined with the circuit board and the elastic main body is attached on a second surface of the circuit board, wherein a cushioning efficacy is provided when the electronic device is suffered from an external force.

18 Claims, 9 Drawing Sheets

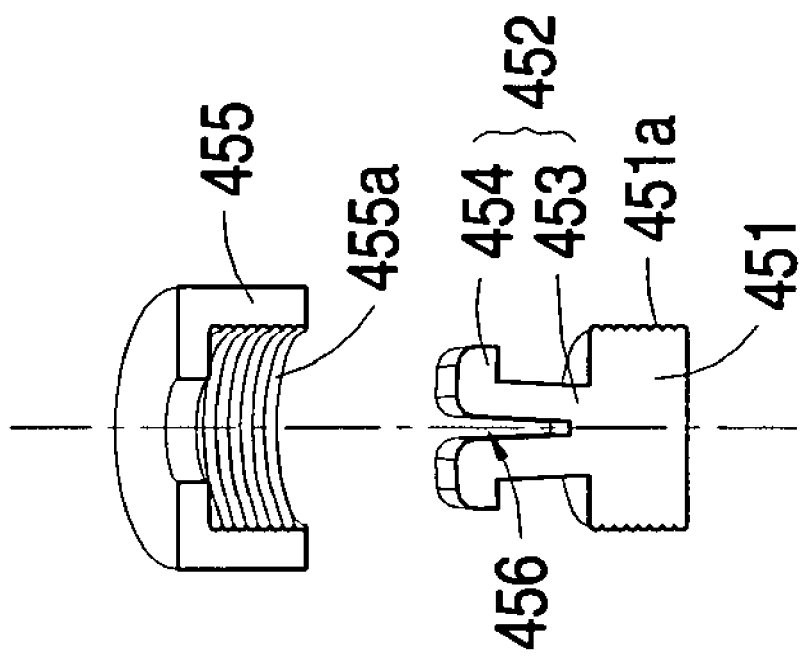

CUSHIONING MEMBER AND ELECTRONIC DEVICE WITH SUCH CUSHIONING MEMBER

CLAIM OF PRIORITY UNDER 35 U.S.C. §119

This application claims priority to Taiwanese Patent Application No. 097113040 filed on Apr. 10, 2008.

FIELD OF THE INVENTION

The present invention relates to a cushioning member, and more particularly to a cushioning member for use in a circuit board of an electronic device.

BACKGROUND OF THE INVENTION

Recently, the general trends in designing portable electronic devices are toward small size, light weightiness and easy portability. The portable electronic devices such as mobile phones, personal digital assistants (PDAs), digital still cameras, digital video cameras, notebook computers and the like have built-in batteries. If no external power supply apparatus is provided to power the portable electronic device, the built-in battery is usually used as the main power source. If the power supplied from the battery is insufficient, the user may simply plug a power supply apparatus (e.g. a power adapter or a charger) into an AC wall outlet commonly found in most homes or offices so as to receive an AC voltage. The AC voltage is then converted into a DC power to be used for the portable electronic device and/or charge the built-in battery.

Referring to FIG. 1A, a schematic exploded view of a conventional power adapter is illustrated. The power adapter 1 principally comprises a casing member 11, a metallic shielding member 12, an insulating member 13 and a circuit board 14. The casing member 11 includes an upper casing part 111 and a lower casing part 112. The metallic shielding member 12 is used for minimizing the influence of electromagnetic interference (EMI) and includes an upper shielding part 121 and a lower shielding part 122. For safety, the insulating member 13 is arranged between the circuit board 14 and the metallic shielding member 12 for isolating the circuit board 14 from the metallic shielding member 12. The insulating member 13 is substantially a thin film layer such as an insulating tape. The insulating member 13 is attached onto the inner surfaces of the upper shielding part 121 and the lower shielding part 122 so as to define a receptacle 131 for accommodating the circuit board 14 therein. Some electronic components 141 are mounted on the circuit board 14 for providing power conversion.

FIG. 1B is a schematic cross-sectional view of the circuit board shown in FIG. 1A. Some of the electronic components 141 have respective pins 142 inserting into holes (not shown) of the circuit board 14 from a first surface 143 to a second surface 144. The pins 142 are fixed on the second surface 144 of the circuit board 14 via solder paste 145 such that the electronic components 141 are mounted on the first surface 143 of the circuit board 14. Generally, after the pins 142 penetrates through the holes, the tips of the pins 142 are protruded from the second surface 144 of the circuit board 14 by a specified length.

During the power adapter 1 is subject to a shock test, the circuit board 14 is suffered from vibration in the vertical direction. If the vibration is too strong, the pins 142 protruded from the second surface 144 of the circuit board 14 may pierce though the insulating member 13 and thus the electronic components 141 on the circuit board 14 will be in direct contact with the metallic shielding member 12. Under this circumstance, the power adapter 1 has a malfunction and the product yield is reduced.

Similarly, if the power adapter 1 is suffered from a drop or a strong impact, the pins 142 protruded from the second surface 144 of the circuit board 14 may pierce though the insulating member 13 and thus the electronic components 141 on the circuit board 14 will be in direct contact with the metallic shielding member 12. Under this circumstance, the power adapter 1 has a breakdown and the reliability of the power adapter 1 is reduced.

Therefore, there is a need of providing a cushioning member for use in a circuit board of an electronic device so as to obviate the drawbacks encountered from the prior art.

SUMMARY OF THE INVENTION

It is an object of the present invention to provide a cushioning member for providing a cushioning efficacy, thereby preventing the pins of the electronic components on the circuit board from piercing through the insulating member when the electronic device is suffered from a drop or a strong impact.

Another object of the present invention provides a cushioning member for alleviating the influence of the impact on the circuit board of an electronic device, thereby enhancing the yield and reliability of the electronic device.

In accordance with an aspect of the present invention, there is provided a cushioning member for use in a circuit board of an electronic device. The cushioning member includes an elastic main body and a fixing element. The fixing element is coupled with the elastic main body and aligned with a perforation of the circuit board. The fixing element includes an extension part and a fastening part. The extension part is arranged between the elastic main body and the fastening part. The fastening part is arranged on an end of the fixing element. The fastening part is sustained against a first surface of the circuit board and the extension part is received in the perforation after the fixing element is penetrated through the perforation, so that the cushioning member is combined with the circuit board and the elastic main body is attached on a second surface of the circuit board, wherein a cushioning efficacy is provided when the electronic device is suffered from an external force.

In accordance with another aspect of the present invention, there is provided an electronic device. The electronic device includes a casing member, a metallic shielding member, an insulating member, a circuit board and a cushioning member. The metallic shielding member is disposed inside the casing member. The insulating member is disposed on an inner surface of the metallic shielding member so as to define a receptacle. The circuit board is disposed within the receptacle and has a perforation. The cushioning member includes an elastic main body and a fixing element. The fixing element is coupled with the elastic main body and aligned with a perforation of the circuit board. The fixing element includes an extension part and a fastening part. The extension part is arranged between the elastic main body and the fastening part. The fastening part is arranged on an end of the fixing element. The fastening part is sustained against a first surface of the circuit board and the extension part is received in the perforation after the fixing element is penetrated through the perforation, so that the cushioning member is combined with the circuit board and the elastic main body is attached on a second surface of the circuit board, wherein a cushioning efficacy is provided when the electronic device is suffered from an external force.

The above contents of the present invention will become more readily apparent to those ordinarily skilled in the art after reviewing the following detailed description and accompanying drawings, in which:

BRIEF DESCRIPTION OF THE DRAWINGS

FIG. 5C is a schematic cutaway view of the cushioning member shown in FIG. 5A.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
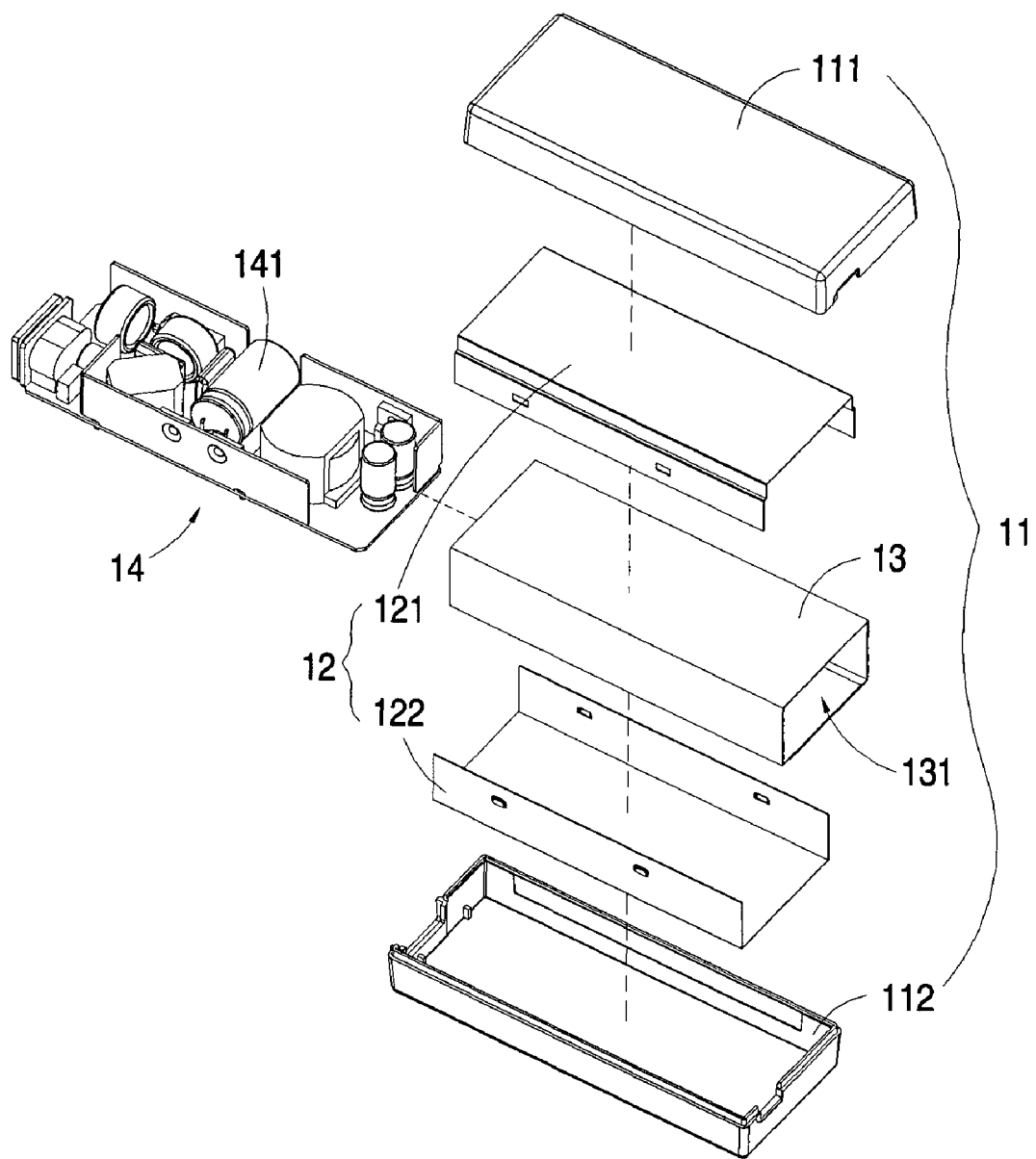
FIG. 1A is a schematic exploded view of a conventional power adapter.
Figure 1B:
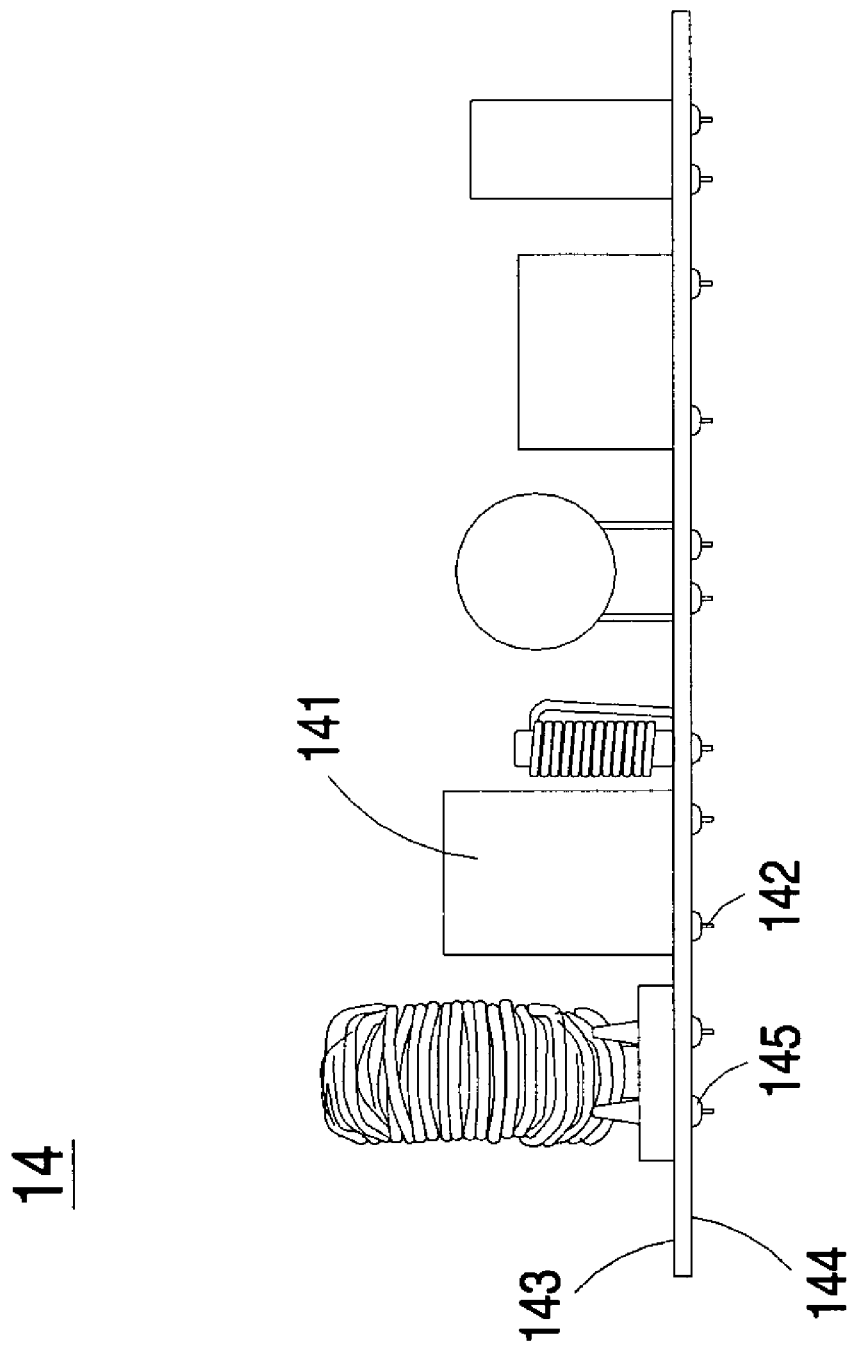
FIG. 1B is a schematic cross-sectional view illustrating the assembled power adapter of FIG. 1A.
Figure 2A:
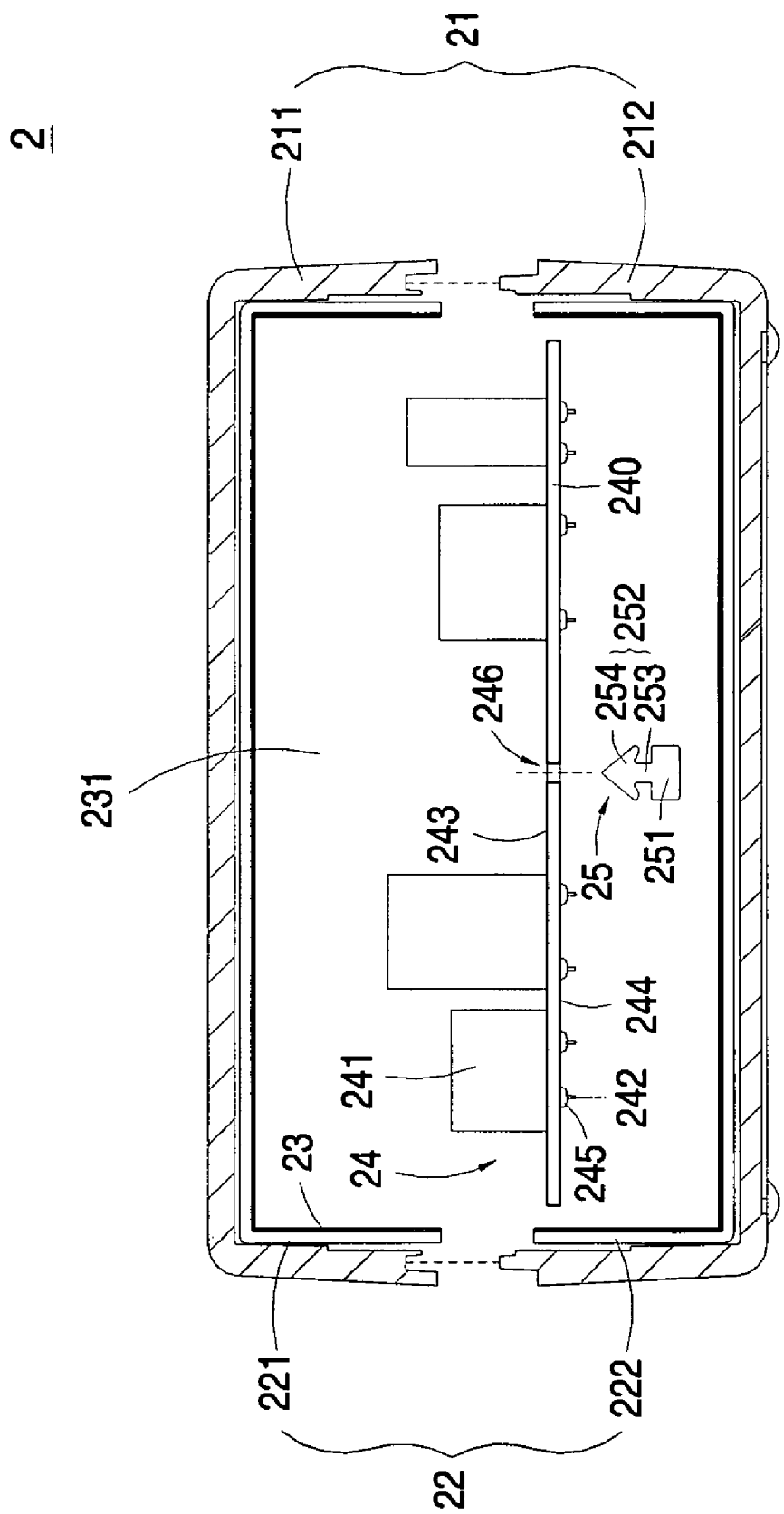
FIG. 2A is a schematic exploded view of an electronic device according to a first preferred embodiment of the present invention.

Referring to FIG. 2A, a schematic exploded view of an electronic device according to a preferred embodiment of the present invention is illustrated. The electronic device 2 of FIG. 2A principally comprises a casing member 21, a metallic shielding member 22, an insulating member 23, a circuit board 24 and a cushioning member 25. The casing member 21 includes an upper casing part 211 and a lower casing part 212. The metallic shielding member 22 is arranged within the casing member 21. The metallic shielding member 22 is used for minimizing the influence of electro-magnetic interference (EMI) and includes an upper shielding part 221 and a lower shielding part 222. For safety, the insulating member 23 is arranged between the circuit board 24 and the metallic shielding member 22 for isolating the circuit board 24 from the metallic shielding member 22. The insulating member 23 is substantially a thin film layer such as an insulating tape. The insulating member 23 is attached onto the inner surfaces of the upper shielding part 221 and the lower shielding part 222 so as to define a receptacle 231 for accommodating the circuit board 24 therein.

Some electronic components 241 are mounted on the circuit board 24 for providing power conversion. In this embodiment, the circuit board 24 is a printed circuit board. The circuit board 24 is mounted within the receptacle 231 and isolated from the metallic shielding member 22 by the insulating member 23. Some of the electronic components 241 have respective pins 242 inserting into holes (not shown) of the circuit board 24 from a first surface 243 to a second surface 244. The pins 242 are fixed on the second surface 244 of the circuit board 24 via solder paste 245 such that the electronic components 241 are mounted on the first surface 243 of the circuit board 24. In addition, the circuit board 24 has a perforation 246.

Please refer to FIG. 2A again. The cushioning member 25 of the electronic device 2 comprises an elastic main body 251 and a fixing element 252. The fixing element 252 is coupled with the elastic main body 251 and comprises an extension part 253 and a fastening part 254. The extension part 253 is arranged between the elastic main body 251 and the fastening part 254. The fastening part 254 is arranged on an end of the fixing element 252. In some embodiments, the fastening part 254 has an anchor structure, which may be sustained against the first surface 243 of the circuit board 24.

In some embodiments, the elastic main body 251 and the fixing element 252 are integrally formed into one piece. The elastic main body 251 has an elastic solid structure. The shape of the elastic main body 251 may be varied according to practical requirements. For example, the elastic main body 251 may have a circular or rectangular cross section. It is preferred that the cushioning member 25 is made of vibration absorbing material such as silicon, thermoplastic elastomer (TPE), thermoplastic rubber (TPR), polyvinyl chloride, rubber and the like.

Figure 2B:
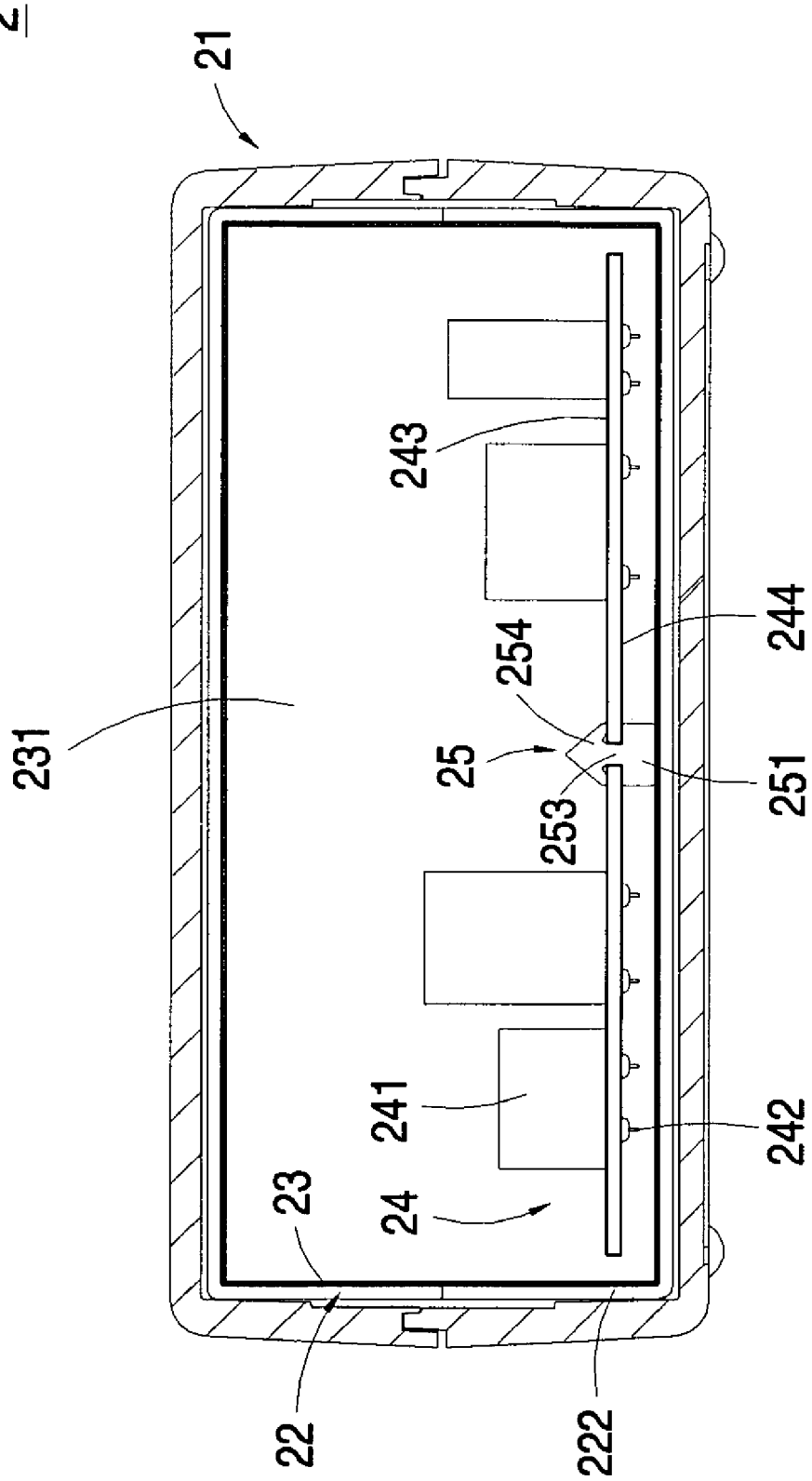
FIG. 2B is a schematic assembled view of the electronic device shown in FIG. 2A.

Hereinafter, a process of mounting the cushioning member 25 on the circuit board 24 will be illustrated in more details with reference to FIG. 2A and FIG. 2B.

First of all, the fastening part 254 of the fixing element 252 is penetrated through the perforation 246 of the circuit board 24. Next, the fastening part 254 is sustained against the first surface 243 of the circuit board 24 such that the extension part 253 is received in the perforation 246. Meanwhile, the cushioning member 25 is combined with the circuit board 24 (as shown in FIG. 2B), in which the elastic main body 251 of the cushioning member 25 is attached on the second surface 244 of the circuit board 24. Since the tips of the pins 242 are protruded from the second surface 244 of the circuit board 24 by a specified length, the thickness of the elastic main body 251 needs to be greater than the specified length. As a consequence, after the circuit board 24 is accommodated within the receptacle 231, the lower surface of the elastic main body 251 is in direct contact with the insulating member 23 but the pins 242 are spaced from the insulating member 23. Since the cushioning member 25 is made of vibration absorbing material, the cushioning member 25 is deformed when the electronic device 2 is suffered from a drop or a strong impact, thereby providing a cushioning efficacy. In other word, since the circuit board 24 is supported by the cushioning member 25, the vibration amplitude of the circuit board 24 is minimized. Under this circumstance, the pins 242 are not contacted with the insulating member 23 and the possibility of piercing through the insulating member 23 is avoided, so that the yield and the reliability of the electronic device are both enhanced.

Figure 3:
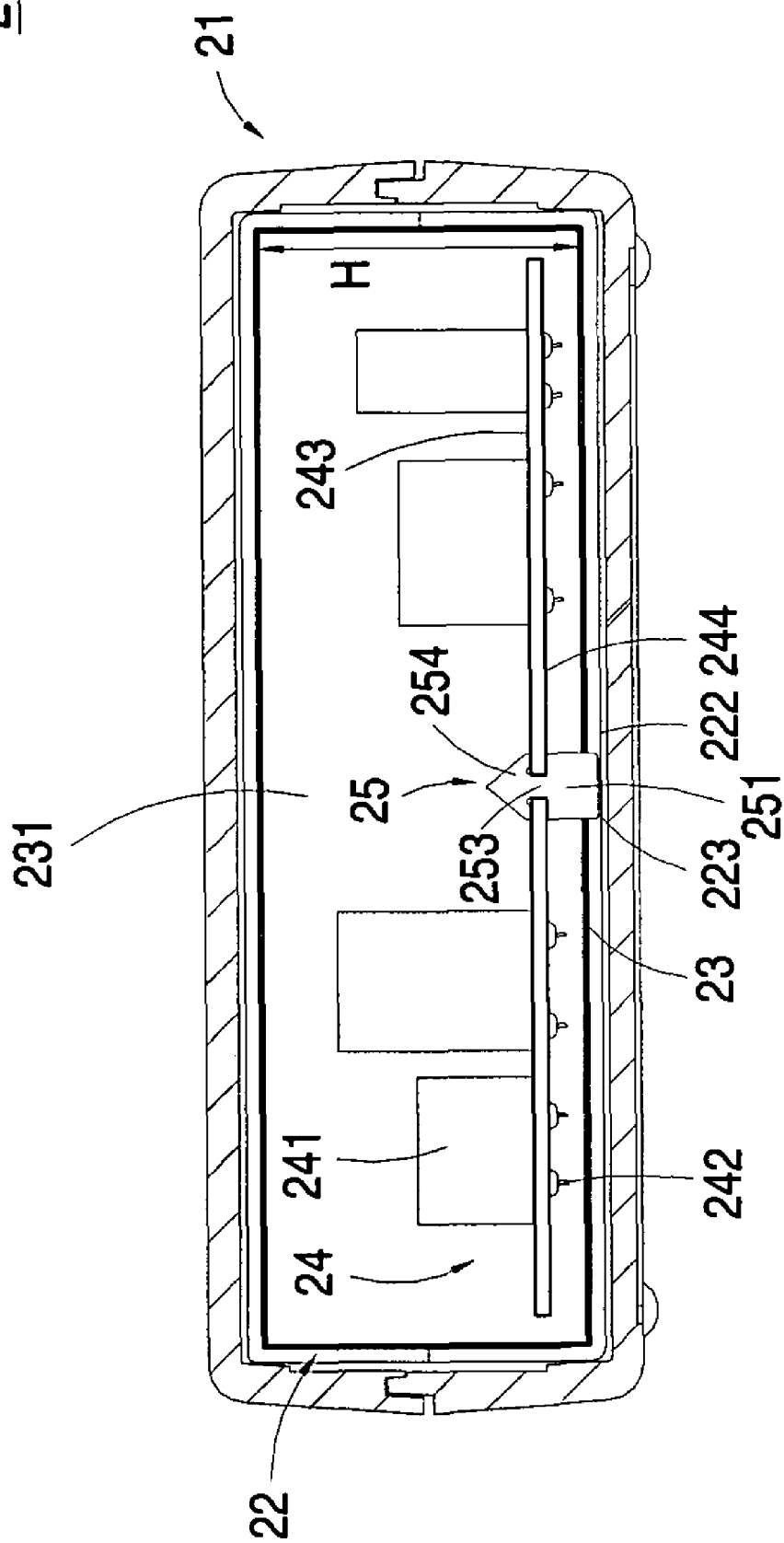
FIG. 3 is a schematic assembled view of an electronic device according to a second preferred embodiment of the present invention.

A further embodiment of an electronic device according to the present invention is illustrated in FIG. 3. The casing member 21, the circuit board 24 and the cushioning member 25 included in the electronic device 2 of FIG. 3 are identical to those shown in FIG. 2, and are not redundantly described herein. In this embodiment, corresponding to the elastic main body 251 of the cushioning member 25, a hollow portion 223 is formed in the lower shielding part 222 of the metallic shielding member 22 and the insulating member 23. The elastic main body 251 of the cushioning member 25 is partially received in the hollow portion 223 so as to facilitate firmly supporting the circuit board 24. Similarly, since the pins 242 are not contacted with the insulating member 23 and the possibility of piercing through the insulating member 23 is avoided when the electronic device 2 is suffered from a drop or a strong impact. Therefore, the yield and the reliability of the electronic device 2 are both enhanced.

In some embodiments, since the vibration amplitude of the circuit board 24 is minimized by using the cushioning member 25, the height H of the receptacle 231 may be reduced so as to reduce the overall thickness of the electronic device 2 (as shown in FIG. 3).

Figure 4:
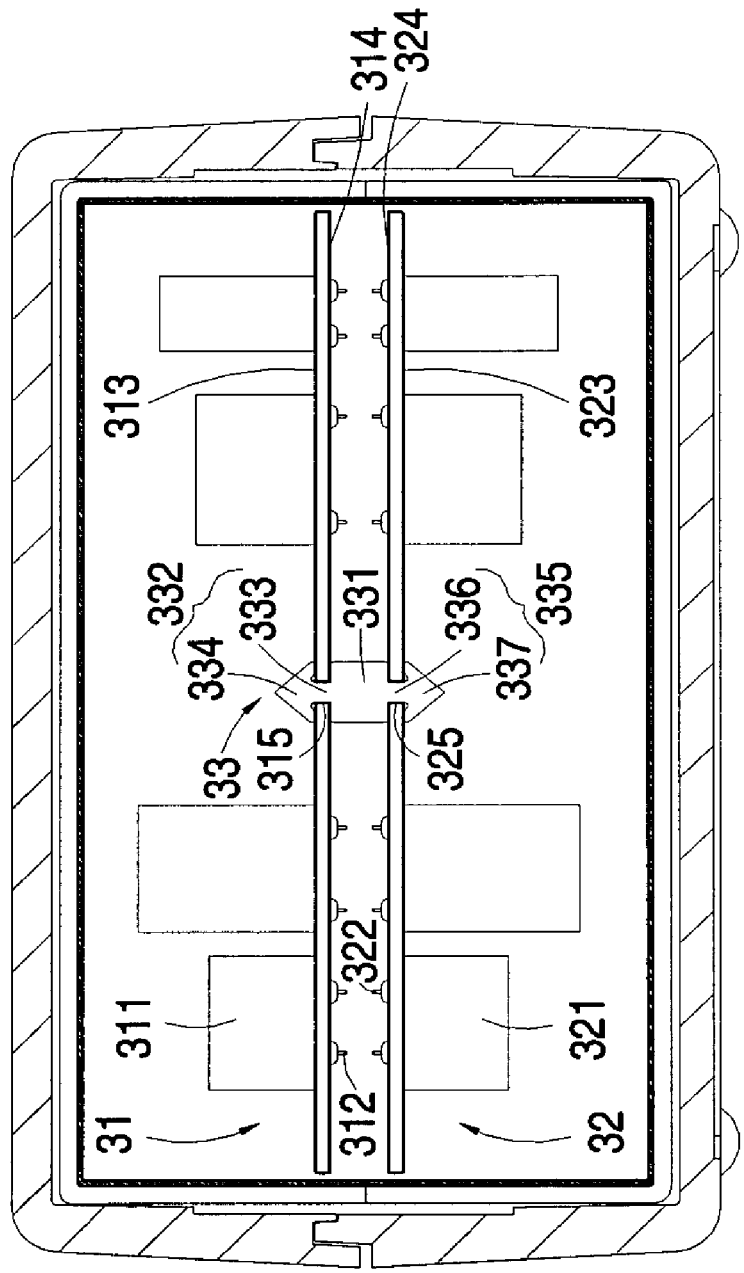
FIG. 4 is a schematic assembled view of an electronic device according to a third preferred embodiment of the present invention.

FIG. 4 is a schematic assembled view of an electronic device according to another preferred embodiment of the present invention. In this embodiment, a cushioning member 33 is arranged between a first circuit board 31 and a second circuit board 32. The cushioning member 33 comprises an elastic main body 331, a first fixing element 332 and a second fixing element 335. The elastic main body 331 is arranged between the first fixing element 332 and the second fixing element 335. The first fixing element 332 comprises a first extension part 333 and a first fastening part 334. The second fixing element 335 comprises a second extension part 336 and a second fastening part 337. In some embodiments, the elastic main body 331, a first fixing element 332 and a second fixing element 335 are integrally formed into one piece. It is preferred that the cushioning member 33 is made of vibration absorbing material such as silicon, thermoplastic elastomer (TPE), thermoplastic rubber (TPR), polyvinyl chloride, rubber and the like.

Hereinafter, a process of mounting the cushioning member 33 between the first circuit board 31 and the second circuit board 32 will be illustrated in more details with reference to FIG. 4. First of all, the first fixing element 332 is penetrated through a first perforation 315 of the first circuit board 31. Next, the first fastening part 334 is sustained against the first surface 313 of the first circuit board 31 such that the first extension part 333 is received in the first perforation 315. Meanwhile, the cushioning member 33 is combined with the first circuit board 31. Next, the second fixing element 335 is penetrated through a second perforation 325 of the second circuit board 32. Next, the second fixing fastening part 337 is sustained against the first surface 323 of the second circuit board 32 such that the second extension part 336 is received in the second perforation 325. Meanwhile, the cushioning member 33 is also combined with the second circuit board 32.

By means of the cushioning member 33, the pins 312 of the electronic components 311 on the first circuit board 31 are spaced from the pins 322 of the electronic components 321 on the second circuit board 32. Since the cushioning member 33 is made of vibration absorbing material, the cushioning member 33 is deformed when the electronic device 3 is suffered from a drop or a strong impact, thereby providing a cushioning efficacy. In other word, since the circuit boards 31 and 32 are supported by the cushioning member 33, the vibration amplitudes of the circuit boards 31 and 32 are minimized. Under this circumstance, the pins 312 are not contacted with the pins 322, so that the yield and the reliability of the electronic device 3 are both enhanced.

Figure 5A:
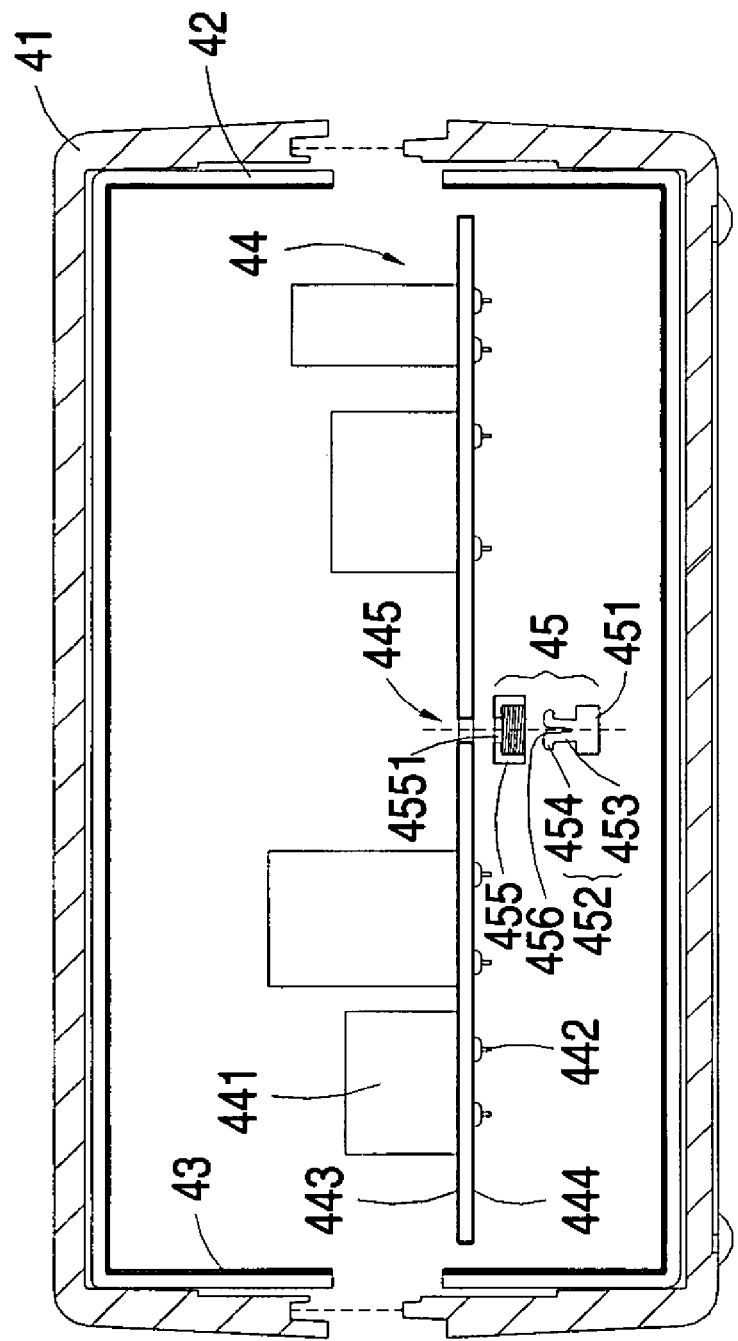
FIG. 5A is a schematic exploded view of an electronic device according to a fourth preferred embodiment of the present invention.
Figure 5B:
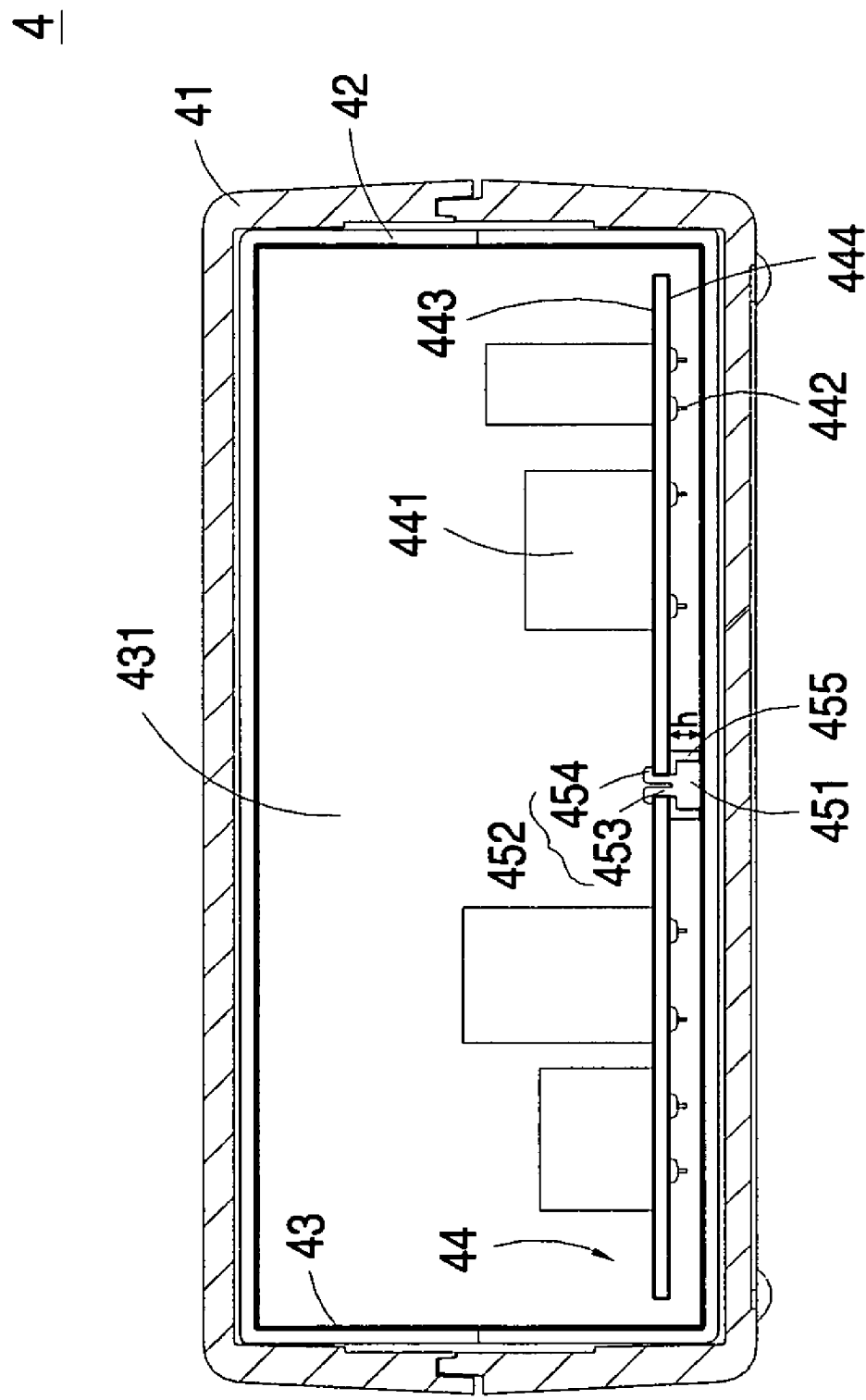
FIG. 5B is a schematic assembled view of the electronic device shown in FIG. 5A.

FIGS. 5A and 5B are respectively schematic exploded and assembled views of an electronic device according to a further preferred embodiment of the present invention. The electronic device 4 principally comprising a casing member 41, a metallic shielding member 42, an insulating member 43, a circuit board 44 and a cushioning member 45. The casing member 41, the metallic shielding member 42, the insulating member 43 and the circuit board 44 included in the electronic device 4 are identical to those shown in FIG. 2A, and are not redundantly described herein. In this embodiment, the cushioning member 45 comprises an elastic main body 451, a fixing element 452 and a sheathing element 455. The fixing element 452 comprises an extension part 453, a fastening part 454 and a notch 456. The extension part 453 is arranged between the elastic main body 451 and the fastening part 454. The fastening part 454 is arranged on an end of the fixing element 452. The notch 456 is formed in the middles of the extension part 453 and the fastening part 454 such that a restoring force is generated during the fastening part 454 is penetrated through a perforation 445 of the circuit board 44. In some embodiments, the elastic main body 451 and the fixing element 452 are integrally formed into one piece. It is preferred that the cushioning member 45 is made of vibration absorbing material such as silicon, thermoplastic elastomer (TPE), thermoplastic rubber (TPR), polyvinyl chloride, rubber and the like.

Hereinafter, a process of mounting the cushioning member 45 on the circuit board 44 will be illustrated in more details with reference to FIGS. 5A and 5B. First of all, the fixing element 452 is penetrated through the opening 4551 of the sheathing element 455 and the perforation 445 of the circuit board 44. During the fastening part 454 is penetrated through the opening 4551 of the sheathing element 455 and the perforation 445 of the circuit board 44, the gap of the notch 456 is shrunken and a restoring force is generated because the fixing element 452 is pressed by the peripheries of the opening 4551 and the perforation 445. After the fastening part 454 has been penetrated through the opening 4551 of the sheathing element 455 and the perforation 445 of the circuit board 44, the gap of the notch 456 is returned to its original state and thus the restoring force is eliminated. Next, the fastening part 454 is sustained against the first surface 443 of the first circuit board 44 such that the extension part 453 is received in the perforation 445 of the circuit board 44 and the opening 4551 of the sheathing element 455 (as shown in FIG. 5B). Meanwhile, the sheathing element 455 is sheathed around the elastic main body 451 and a portion of the extension part 453 and thus the cushioning member 45 is combined with the circuit board 44. The sheathing element 455 may facilitate firmly supporting the circuit board 44 and enhancing the cushioning efficacy of the cushioning member 45.

In some embodiment, the sheathing element 455 has a thread 455a in the inner surface thereof, as is shown in FIG. 5C. Corresponding to the thread 455a, another thread 451a is also formed in the external surface of the elastic main body 451. Due to the engagement between the thread 455a of the sheathing element 455 and the thread 451a of the elastic main body 451, the sheathing element 455 and the elastic main body 451 are securely coupled. When the cushioning member 45 is sheathed by the sheathing element 455 and combined with the circuit board 44 (as shown in FIG. 5B), the engagement between the thread 455a of the sheathing element 455 and the thread 451a of the elastic main body 451 avoids shift of the cushioning member 45 even if the electronic device 4 is suffered from a drop or a strong impact.

Please refer to FIG. 5B again. In this embodiment, the height h of the sheathing element 455 is sufficient to fully enclose the elastic main body 451 of the cushioning member 45. On the other hand, the height h of the sheathing element 455 is greater than the length of the pins 442 protruded from the second surface 444 of the circuit board 44. As a consequence, after the circuit board 44 is accommodated within the receptacle 431, the lower surface of the elastic main body 451 is in direct contact with the insulating member 43 but the pins 442 are spaced from the insulating member 43.

It is noted that, however, those skilled in the art will readily observe that numerous modifications and alterations may be made while retaining the teachings of the invention. For example, the upper side of the elastic main body 451 may be planar, convex or concave. In addition, a hollow portion (not shown) is formed in the metallic shielding member 42 and the insulating member 43 for receiving the main body 451 and the sheathing element 455 therein. The related configurations are similar to that shown in FIG. 3, and are not redundantly described herein.

Since the main body 451 and the sheathing element 455 are made of vibration absorbing material, the main body 451 and the sheathing element 455 are deformed when the electronic device 4 is suffered from a drop or a strong impact, thereby providing a cushioning efficacy. In other word, since the circuit board 44 is supported by the cushioning member 45 and the sheathing element 455, the vibration amplitude of the circuit board 44 is minimized. Under this circumstance, the pins 442 are not contacted with the insulating member 43 and the possibility of piercing through the insulating member 43 is avoided, so that the yield and the reliability of the electronic device 4 are both enhanced.

From the above description, the cushioning member of the present invention is capable of supporting the circuit board and providing a cushioning efficacy because the cushioning member is deformed when the electronic device is suffered from a drop or a strong impact. By using the cushioning member of the present invention, the pins of the electronic components on the circuit board are not contacted with the insulating member and the possibility of piercing through the insulating member is avoided. Therefore, the yield and the reliability of the electronic device are both enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A cushioning member for use in a circuit board of an electronic device, said circuit board having a perforation, said cushioning member comprising:
   an elastic main body;
   a fixing element coupled with said elastic main body and aligned with said perforation of said circuit board, and comprising an extension part and a fastening part, said extension part being arranged between said elastic main body and said fastening part, said fastening part being arranged on an end of said fixing element; and
   a sheathing element sheathed around said elastic main body and a portion of said extension part after said fastening part of said fixing element is penetrated through said perforation, thereby facilitating fixing said elastic main body and said fixing element onto said circuit board;
   wherein said fastening part is sustained against a first surface of said circuit board and said extension part is received in said perforation after said fixing element is penetrated through said perforation, so that said cushioning member is combined with said circuit board and said elastic main body is attached on a second surface of said circuit board, wherein a cushioning efficacy is provided when said electronic device is suffered from an external force.

2. The cushioning member according to claim 1 wherein said circuit board is a printed circuit board.

3. The cushioning member according to claim 1 wherein said elastic main body has an elastic solid structure.

4. The cushioning member according to claim 1 wherein said elastic main body and said fixing element are integrally formed.

5. The cushioning member according to claim 1 wherein said cushioning member is made of vibration absorbing material.

6. The cushioning member according to claim 5 wherein said vibration absorbing material is selected from a group consisting of silicon, thermoplastic elastomer (TPE), thermoplastic rubber (TPR), polyvinyl chloride and rubber.

7. The cushioning member according to claim 1 wherein said fastening part has an anchor structure.

8. The cushioning member according to claim 1 wherein a notch is formed in the middles of said extension part and said fastening part of said fixing element such that a restoring force is generated during said fastening part is penetrated through said perforation of said circuit board.

9. The cushioning member according to claim 1 wherein said sheathing element further comprises an opening corresponding to said perforation of said circuit board for said fixing element to penetrate therethrough.

10. The cushioning member according to claim 1 wherein an inner surface of said sheathing element has a thread and an external surface of said elastic main body has another thread to be engaged with said thread of said sheathing element.

11. The cushioning member according to claim 1 wherein said first surface and said second surface of said circuit board are opposed to each other.

12. An electronic device comprising:
    a casing member;
    a metallic shielding member disposed inside said casing member;
    an insulating member disposed on an inner surface of said metallic shielding member so as to define a receptacle;
    a circuit board disposed within said receptacle and having a perforation; and
    a cushioning member comprising:
    an elastic main body;
    a fixing element coupled with said elastic main body and aligned with said perforation of said circuit board, and comprising an extension part and a fastening part, said extension part being arranged between said elastic main body and said fastening part, said fastening part being arranged on an end of said fixing element; and
    a sheathing element sheathed around said elastic main body and a portion of said extension part after said fastening part of said fixing element is penetrated through said perforation, thereby facilitating fixing said elastic main body and said fixing element onto said circuit board;
    wherein said fastening part is sustained against a first surface of said circuit board and said extension part is received in said perforation after said fixing element is penetrated through said perforation, so that said cushioning member is combined with said circuit board and said elastic main body is attached on a second surface of said circuit board, wherein a cushioning efficacy is provided when said electronic device is suffered from an external force.

13. The electronic device according to claim 12 wherein said circuit board is a printed circuit board.

14. The electronic device according to claim 12 wherein a notch is formed in the middles of said extension part and said fastening part of said fixing element such that a restoring force is generated during said fastening part is penetrated through said perforation of said circuit board.

15. The electronic device according to claim 12 wherein said sheathing element further comprises an opening corresponding to said perforation of said circuit board for said fixing element to penetrate therethrough.

16. The electronic device according to claim 12 wherein an inner surface of said sheathing element has a thread and an external surface of said elastic main body has another thread to be engaged with said thread of said sheathing element.

17. The electronic device according to claim 12 wherein said first surface and said second surface of said circuit board are opposed to each other.

18. The electronic device according to claim 12 wherein a hollow portion is formed in said metallic shielding member and said insulating member for partially receiving said cushioning member therein.

* * * * *